(12) United States Patent
Iwamoto et al.

(10) Patent No.: US 8,625,360 B2
(45) Date of Patent: Jan. 7, 2014

(54) SEMICONDUCTOR STORAGE DEVICE OPERATIVE TO SEARCH FOR DATA

(75) Inventors: Hisashi Iwamoto, Kanagawa (JP); Yuji Yano, Kanagawa (JP); Koji Yamamoto, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 268 days.

(21) Appl. No.: 13/165,457

(22) Filed: Jun. 21, 2011

(65) Prior Publication Data

US 2011/0310648 A1 Dec. 22, 2011

(30) Foreign Application Priority Data

Jun. 21, 2010 (JP) .................................. 2010-140406

(51) Int. Cl.
G11C 7/10 (2006.01)
(52) U.S. Cl.
USPC .................................. 365/189.04; 365/189.07
(58) Field of Classification Search
None
See application file for complete search history.

(56) References Cited

U.S. PATENT DOCUMENTS 6,141,261 A * 10/2000 Patti ........................ 365/189.07

FOREIGN PATENT DOCUMENTS

JP 2000-048578 2/2000

OTHER PUBLICATIONS

Rice, "Row-Accessed Content Addressable Memory," Apr. 1995, IBM Technical Disclosure Bulletin, vol. 28, No. 4. pp. 285-288.*
Wakerly, "Digital Design Principles and Practices," 2nd Edition. 1994, Prentice Hall. 22 pages, excerpts from Chapter 5 (priority encoders) and Chapter 9 (counters).*

* cited by examiner

Primary Examiner — Alexander Sofocleous
(74) Attorney, Agent, or Firm — McDermott Will & Emery LLP

(57) ABSTRACT

To provide a semiconductor storage device capable of performing a search of the next data while performing a search of certain data. A first comparator compares data output to a bit line from a memory cell with first search data by activating a word line. A second comparator compares data output to a bit line from the memory cell with second search data by activating a word line. Data output to a bit line by the activation of one word line is input to both the first comparator and second comparator.

2 Claims, 11 Drawing Sheets

FIRST PRIORITY ENCODER

SECOND PRIORITY ENCODER

SEMICONDUCTOR STORAGE DEVICE OPERATIVE TO SEARCH FOR DATA

CROSS-REFERENCE TO RELATED APPLICATIONS

The disclosure of Japanese Patent Application No. 2010-140406 filed on Jun. 21, 2010 including the specification, drawings and abstract is incorporated herein by reference in its entirety.

BACKGROUND

The present invention relates to a semiconductor storage device and, more particularly, to a semiconductor storage device having a search function.

Conventionally, a semiconductor storage device having a search function is known. For example, in the semiconductor storage device described in Patent Document 1 (Japanese Patent Laid-Open No. 2000-48578), when a data search is performed, the search key data input from CPU etc. is held in the search key data holding register 5 and in the data coincidence detection unit 6, the search key data held in the search key data holding register 5 and data stored in the associative memory 1 are collated and all coincident addresses are detected. Next, in the priority encoder 7, an address with the highest priority is selected from among all the addresses detected in the data coincidence detection unit 6 and output to the address selector 3 and the address encoder 8 (see paragraphs [0026], [0027]).

SUMMARY

However, with the device described in Patent Document 1, when an instruction to search the next data is issued while a search of certain data is being performed, a search of the next data cannot be performed until the search being performed is completed.

Therefore, the present invention has been made in view of the above circumstances and provides a semiconductor storage device capable of performing a search of the next data while a search of certain data is being performed.

A semiconductor storage device in an embodiment of the present invention comprises a memory cell array including a plurality of memory cells arranged in a matrix, a first comparator comparing data output to a bit line from the memory cell with first search data by activating a word line, and a second comparator comparing data output to a bit line from the memory cell with second search data by activating the word line. The data output to the bit line by the activation of one word line is input to both the first comparator and second comparator at the same time.

According to the semiconductor storage device in the embodiment of the present invention, it is possible to perform a search of the next data while a data search is being performed.

DETAILED DESCRIPTION

Hereinafter, embodiments of the present invention are explained with reference to the drawings.

First Embodiment

Figure 1:
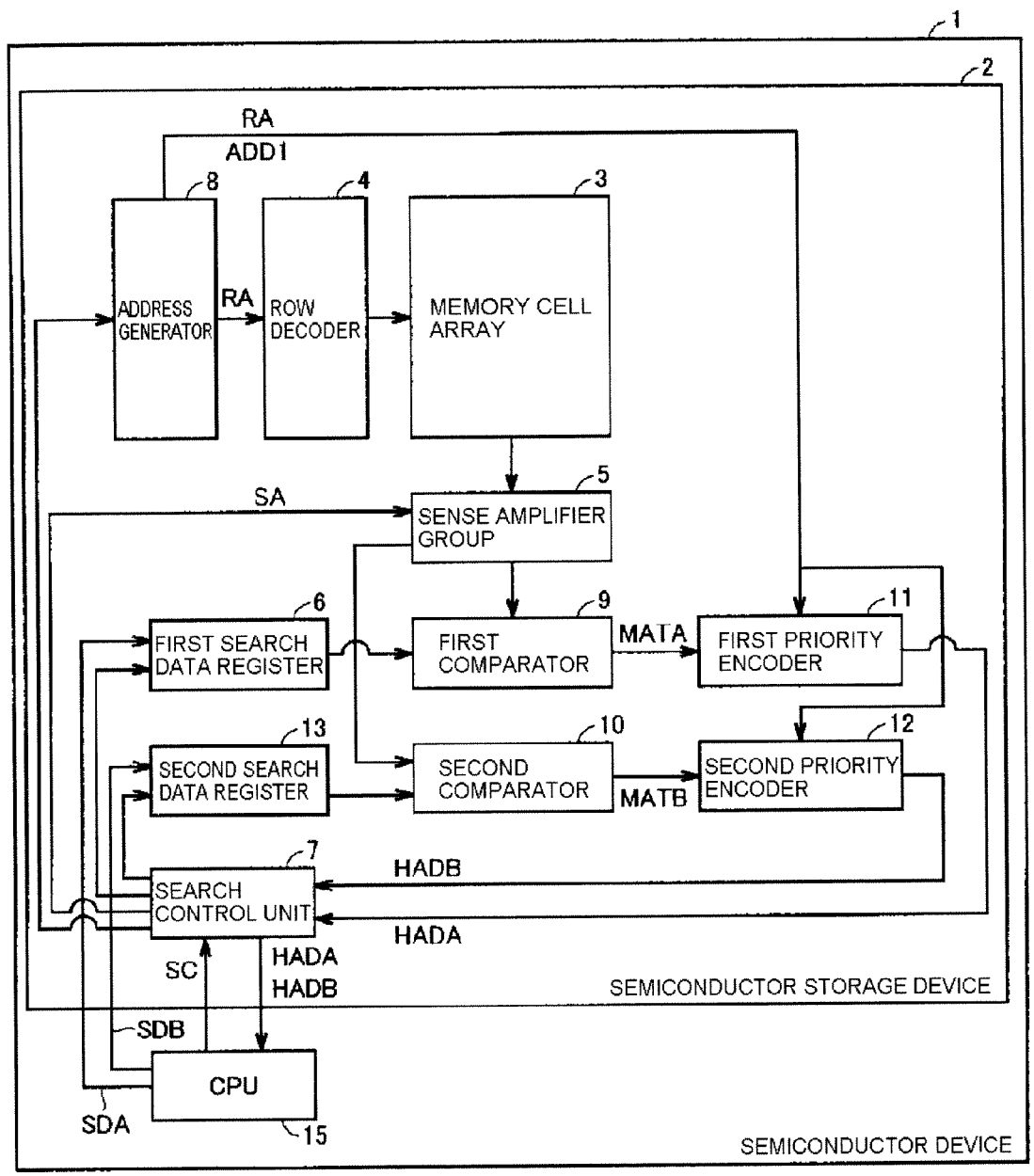
FIG. 1 is a diagram showing a configuration of a semiconductor device in a first embodiment.

FIG. 1 is a diagram showing a configuration of a semiconductor device in a first embodiment.

Referring to FIG. 1, a semiconductor device 1 includes a semiconductor storage device 2 and a CPU 15. The semiconductor storage device 2 comprises a memory cell array 3, a row decoder 4, a sense amplifier group 5, a first search data register 6, a second search data register 13, a search control unit 7, an address generator 8, a first comparator 9, a second comparator 10, a first priority encoder 11, and a second priority encoder 12.

The CPU 15 gives the semiconductor storage device 2 a search command SC, search data SDA, SDB. Further, the CPU 15 receives addresses HADA, HADB representing rows in which the search data SDA, SDB are stored from the semiconductor storage device 2.

The memory cell array 3 includes a plurality of SRAM cells arranged in a matrix.

(Memory Cell Array 3)

Figure 2:
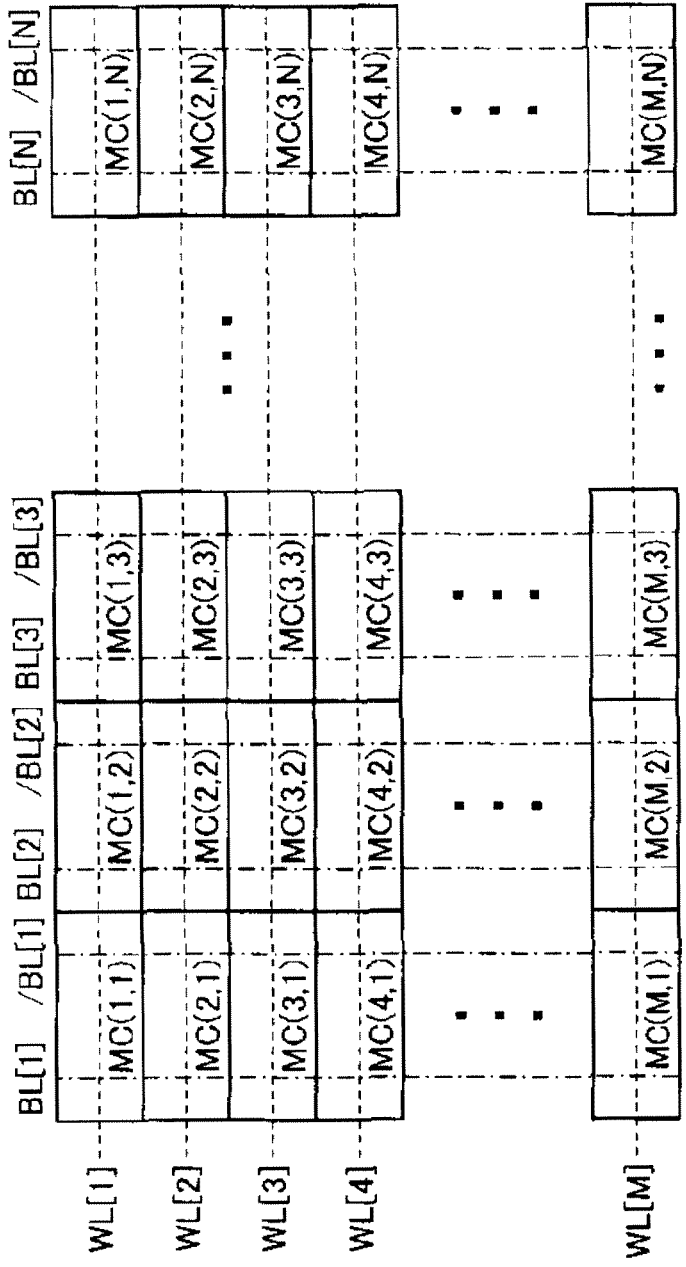
FIG. 2 is a diagram showing a configuration of a memory cell array in the first embodiment.

FIG. 2 is a diagram showing a configuration of the memory cell array 3 in the first embodiment.

The memory cell array 3 comprises memory cells MC (i, j) (i=1 to M, j=1 to N) arranged in a matrix in which M memory cells are arranged in a row direction and N memory cells in a column direction.

The M memory cells MC in a j-th column (j=1 to N) (i, j) (i=1 to M) are coupled to a bit line pair BL [j], /BL [j]. The N memory cells MC in an i-th row (i=1 to M) (i, j) (j=1 to N) are coupled to a word line WL [i].

When the word line WL [i] is activated by the row decoder 4, the stored values in the N memory cells MC in the i-th row (i, j) (j=1 to N) are output to the bit line BL [j] and complementary values of the stored values in the N memory cells MC in the i-th row (i, j) (j=1 to N) are output to the bit line /BL [j].

The sense amplifier group 5 comprises a sense amplifier provided for each column. When a sense amplifier control signal SA is activated to [H] level, each sense amplifier amplifies a voltage of a bit line pair in the corresponding column and outputs it to the first comparator 9 and the second comparator 10.

The first search data register 6 and the second search data register 13 each accumulate the N-bit search data SDA, SDB input from outside.

Figure 3A:
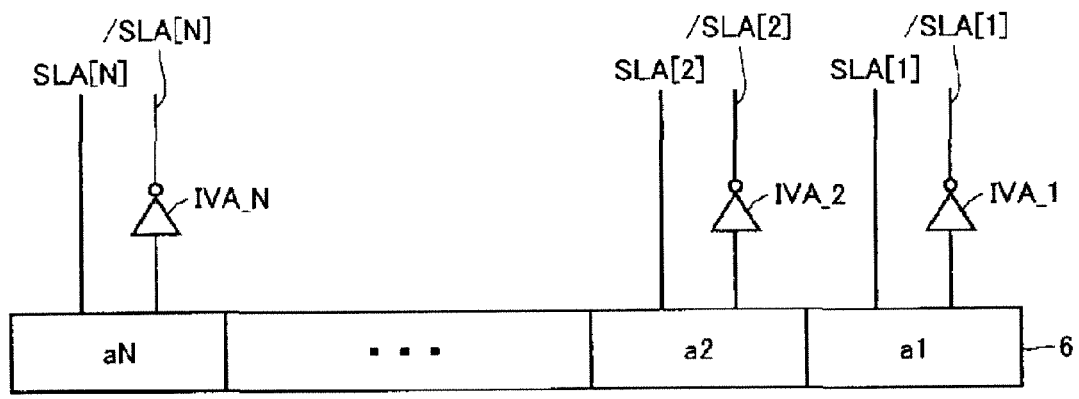
FIG. 3(*a*) is a diagram showing an example of search data stored in a first search data register in FIG. 1 and FIG. 3(*b*) is a diagram showing an example of search data stored in a second search data register in FIG. 1.

FIG. 3(a) is a diagram showing an example of search data stored in the first search data register 6 in FIG. 1.

Referring to FIG. 3(a), first N-bit search data (a1, a2, ..., aN) stored in the first search data register 6 is output to the first comparator 9 through N first search data line pairs SLA [1], /SLA [1] to SLA [N], /SLA [N]. Here, the value at the i-th bit of the first search data is given to SLA [i] and the complementary value of the value at the i-th bit of the first search data is given to /SLA [i].

Figure 3B:
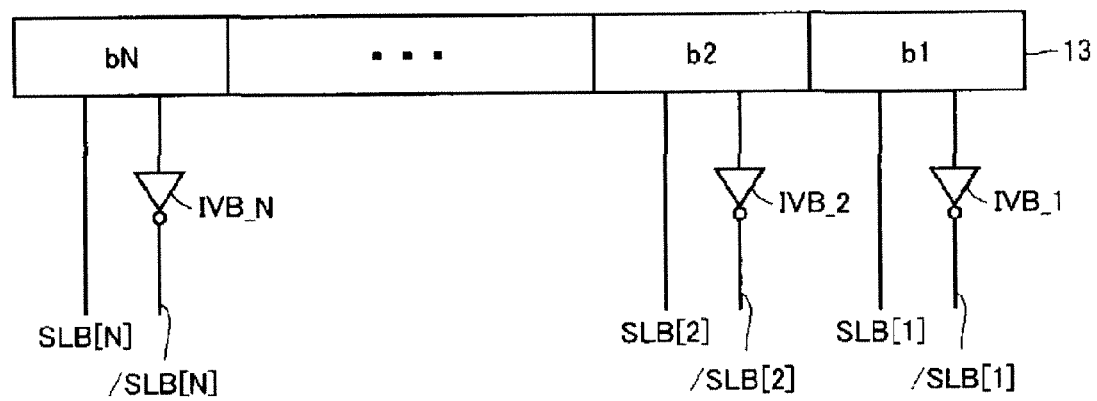

FIG. 3(b) is a diagram showing an example of search data stored in the second search data register 13 in FIG. 1.

Second N-bit search data (b1, b2, ..., bN) stored in the second search data register 13 is output to the second comparator 10 through N second search data line pairs SLB [1], /SLB [1] to SLB [N], /SLB [N]. Here, the value at the i-th bit of the second search data is given to SLB [i] and the complementary value of the value at the i-th bit of the second search data is given to /SLB [i].

When the search command SC is input from outside, the search control unit 7 starts a first search or second search. That is, the search control unit 7 starts the first search by activating a first search control signal SRA to [H] level according to the input of the first search command SC. The search control unit 7 outputs the first search control signal SRA to the first priority encoder 11. After activating the first search control signal SRA, the search control unit 7 sequentially specifies the first to M-th rows one by one for the first search to the address generator 8. Further, the search control unit 7 activates the sense amplifier control signal SA to [H] level in synchronization with the specification of each row of the first to M-th rows. After specifying the M-th row, the search control unit 7 outputs the coincident address HADB output from the first priority encoder 11 to outside.

The search control unit 7 starts the second search by activating a second search control signal SRB to [H] level according to the input of the second search command SC. The search control unit 7 outputs the second search control signal SRB to the second priority encoder 12. Further, when activating the second search control signal SRB, the search control unit 7 further specifies the first to (K−1)th rows sequentially one by one for the second search after specifying the M-th row when specifying the K-th row for the first search and the second search next to the address generator 8. Due to this, it is possible to limit a range in which data is read from the memory cell for the second search to a range necessary and sufficient and unnecessary power consumption can be avoided. The search control unit 7 activates the sense amplifier control signal SA to [H] level in synchronization with the specification of each row of the first to (K−1)th rows. After specifying the (K−1)th row, the search control unit 7 outputs the coincident address HADB output from the second priority encoder 12 to outside.

The address generator 8 generates a row address RA of the row specified by the search control unit 7 and outputs it to the row decoder 4, the first priority encoder 11, and the second priority encoder 12. The address generator 8 outputs a first row signal ADD1 to the first priority encoder 11 and the second priority encoder 12. When the row address RA generated is the row address of the first row, the address generator 8 activates the first row signal ADD1 to "H" level, which is output to the first priority encoder 11 and the second priority encoder 12.

The row decoder 4 activates the word line WL according to the row address RA sent from the address generator 8.

(Comparator)

Figure 4:
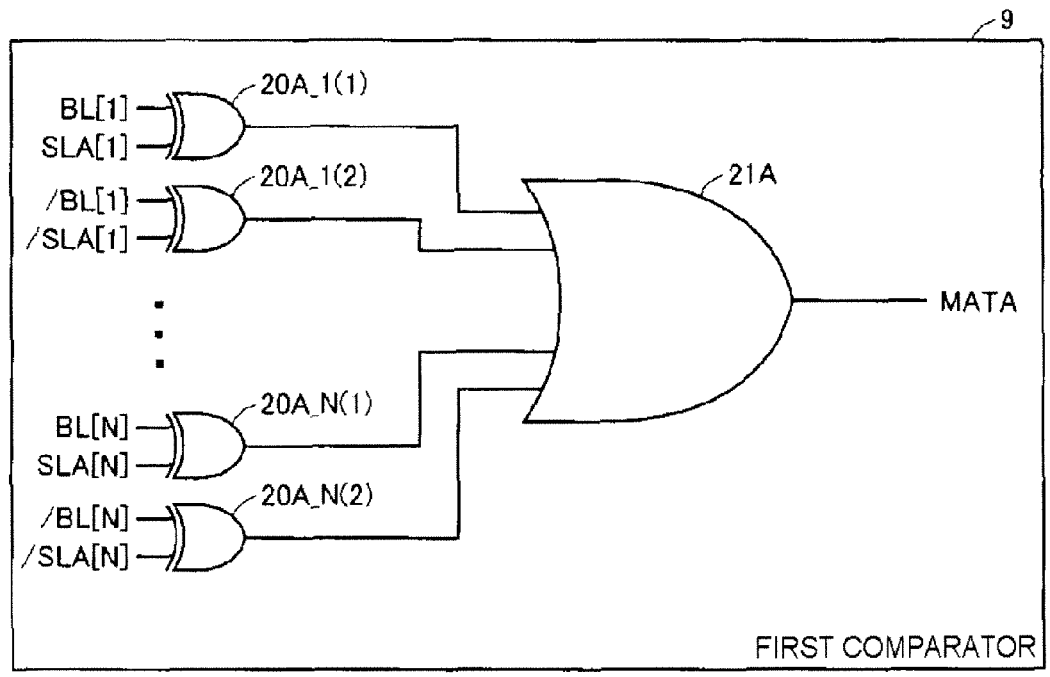
FIG. 4 is a diagram showing a configuration of a first comparator in FIG. 1.

FIG. 4 is a diagram showing a configuration of the first comparator 9 in FIG. 1.

Referring to FIG. 4, the first comparator 9 comprises 2N anticoincidence circuits 20A_i (1), 20A_i (2) (i=1 to N) and one logical sum circuit 21A.

The anticoincidence circuit 20A_i (1) outputs "L" level when the value of the bit line BL [i] agrees with the value of the first search data line SLA [i] and outputs "H" level when not.

The anticoincidence circuit 20A_i (2) outputs "L" level when the value of the bit line /BL [i] agrees, with the value of the first search data line /SLA [i] and outputs "H" level when not.

The logical sum circuit 21A outputs a logical sum of the outputs of the 2N anticoincidence circuits 20A_i (1), 20A_i (2) (i=1 to N) as a search determination signal MATA. That is, the search determination signal MATA turns to "L" level when the stored value in the N-bit cell memory agrees with the first search data and turns to "H" level when not in any of the bits.

Figure 5:
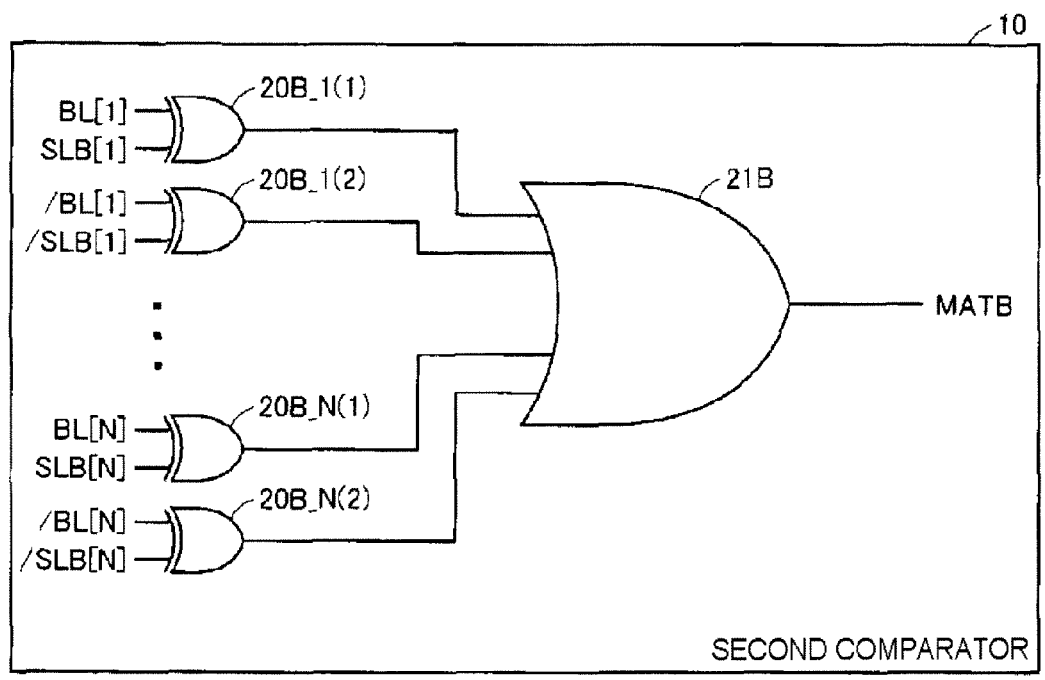
FIG. 5 is a diagram showing a configuration of a second comparator in FIG. 1.

FIG. 5 is a diagram showing a configuration of the second comparator 10 in FIG. 1. Referring to FIG. 5, the second comparator 10 comprises 2N anticoincidence circuits 20B_i (1), 20B_i (2) (i=1 to N) and one logical sum circuit 21B.

The anticoincidence circuit 20B_i (1) outputs "L" level when the value of the bit line BL [i] agrees with the value of the second search data line SLB [i] and outputs "H" level when not.

The anticoincidence circuit 20B_i (2) outputs "L" level when the value of the bit line /BL [i] agrees with the value of the second search data line /SLB [i] and outputs "H" level when not.

The logical sum circuit 21B outputs a logical sum of the outputs of the 2N anticoincidence circuits 20B_i (1), 20B_i (2) (i=1 to N) as a search determination signal MATB. That is, the search determination signal MATB turns to "L" level when the stored value in the N-bit cell memory agrees with the second search data and turns to "H" level when not in any of the bits.

(Priority Encoder)

Figure 6:
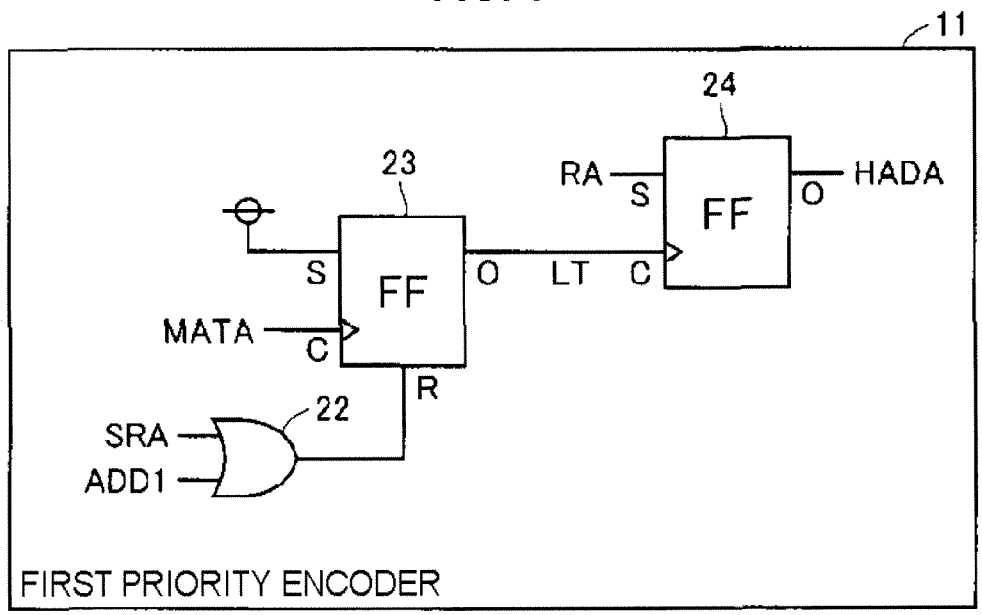
FIG. 6 is a diagram showing a first priority encoder in FIG. 1.

FIG. 6 is a diagram showing a configuration of the first priority encoder 11 in FIG. 1.

Referring to FIG. 6, the first priority encoder 11 comprises a logical sum circuit 22, a first latch circuit 23, and a second latch circuit 24.

The logical sum circuit 22 receives the first search control signal SRA and the first row signal ADD1. The logical sum circuit 22 outputs a signal at "H" level and resets the first latch circuit 23 when the first search control signal SRA is activated to "H" level or the first row signal ADD1 is activated to "H" level.

The first latch circuit 23 receives "H" level at a set terminal S, the search determination signal MATA at a clock terminal C, and the output of the logical sum circuit 22 at a reset terminal R and outputs a latch signal LT1 from an output terminal O.

The second latch circuit 24 receives the row address RA at the set terminal S and the output of the first latch circuit 23 at the clock terminal C and outputs the coincident address HADA from the output terminal O.

The first latch circuit 23 and the second latch circuit 24 latch the row address RA at the time of the first hit and output it as the coincident address HADA. However, the first latch circuit 23 and the second latch circuit 24 reset the latched row address when the first search control signal SRA is activated to "H" level or the first row signal ADD1 is activated to "H"

level and latch the row address RA at the time of the next hit and output it as the coincident address HADA.

Figure 7:
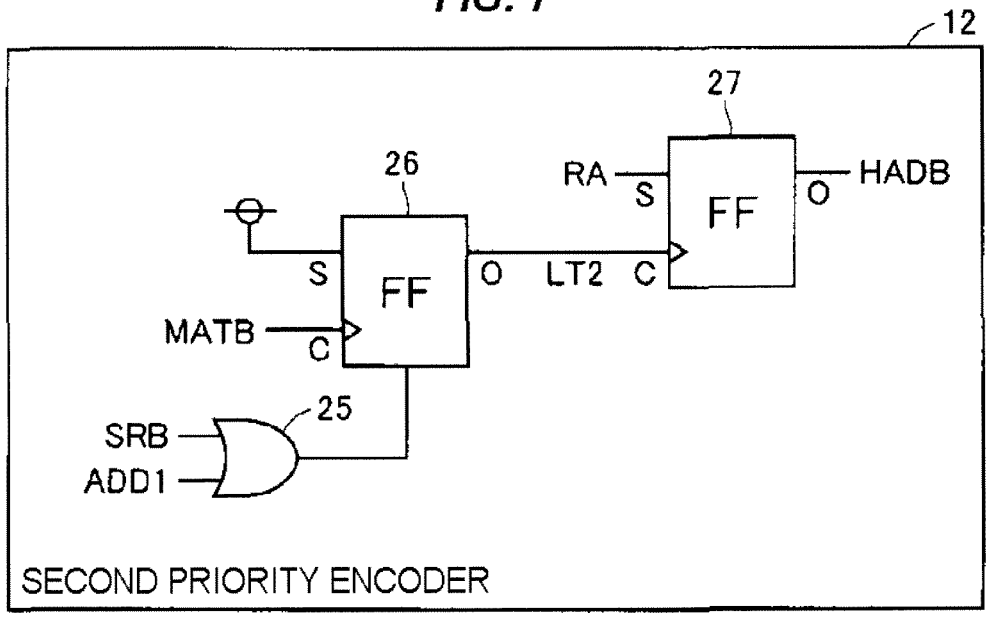
FIG. 7 is a diagram showing a second priority encoder in FIG. 1.

FIG. 7 is a diagram showing a configuration of the second priority encoder 12 in FIG. 1. Referring to FIG. 7, the second priority encoder 12 comprises a logical sum circuit 25, a first latch circuit 26, and a second latch circuit 27.

The logical sum circuit 25 receives the second search control signal SRB and the first row signal ADD1. The logical sum circuit 25 outputs a signal at "H" level and resets the first latch circuit 26 when the second search control signal SRB is activated to "H" level or the first row signal ADD1 is activated to "H" level.

The first latch circuit 26 receives "H" level at the set terminal S, the search determination signal MATB at the clock terminal C, and the output of the logical sum circuit 25 at the reset terminal R and outputs a latch signal LT2 from the output terminal O.

The second latch circuit 27 receives the row address RA at the set terminal S and the output of the first latch circuit 26 at the clock terminal C and outputs the coincident address HADB from the output terminal O.

The first latch circuit 26 and the second latch circuit 27 latch the row address RA at the time of the first hit and output it as the coincident address HADB. However, the first latch circuit 26 and the second latch circuit 27 reset the latched row address when the second search control signal SRB is activated to "H" level or the first row signal ADD1 is activated to "H" level and latch the row address RA at the time of the next hit and output it as the coincident address HADB.

By comprising such the first priority encoder 11 with the second priority encoder 12 as described above, when there is a hit in a plurality of row addresses it is possible to output a row address with high priority (row address with a small value) as an address that is hit. It is also possible to obviate the need of performing the second search and the first search from the top of the row address by providing a function to reset the row address latched when there is a hit at the time of returning to the top address within the first priority encoder 11 and the second priority encoder 12.

When performing the first search from the top row address without exception, the first priority encoder 11 may be one not having such a reset function.

(Operation)

Figure 8:
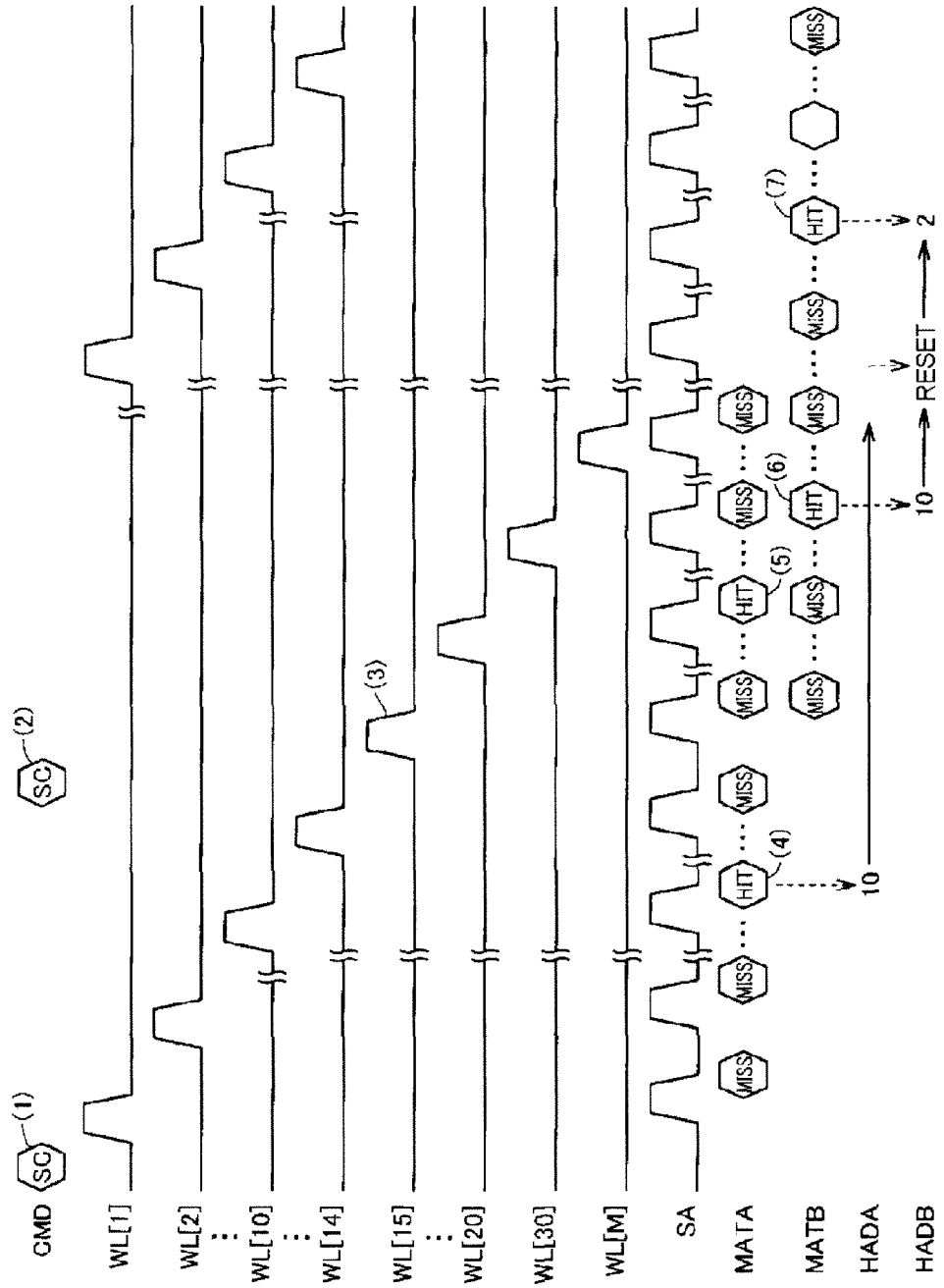
FIG. 8 is a timing chart showing an operation of the semiconductor device in the first embodiment.

FIG. 8 is a timing chart showing the operation of the semiconductor device in the first embodiment.

Referring to FIG. 8, the search control unit 7 starts the first search by activating the first search control signal SRA to "H" level according to the input of the first search command SC (shown in (1)). In the first search register 6, the first N-bit search data (a1, a2, . . . aN) is stored.

The search control unit 7 sequentially specifies the first to M-th rows one by one to the address generator 8. The address generator 8 sequentially generates the row address specified and the row decoder 4 sequentially activates the word lines WL [1] to WL [M]. Further, the search control unit 7 activates the sense amplifier control signal SA to "H" level in synchronization with the specification of each row of the first to M-th rows.

On the other hand, the search control unit 7 starts the second search by activating the second search control signal SRB to "H" level according to the input of the second search command SC (shown in (2)). In the second search data register 13, the second N-bit search data (b1, b2, . . . bN) is stored.

Further, when activating the second search control signal SRB, the search control unit 7 further specifies the first to fourteenth rows sequentially one by one for the second search after specifying the M-th row when specifying, for example, the fifteenth row (shown in (3)) for the first search and the second search to the address generator 8. The address generator 8 sequentially generates the row addresses specified and the row decoder 4 activates the word lines WL [1] to WL [14]. Further, the search control unit 7 activates the sense amplifier control signal SA to "H" level in synchronization with the specification of each row of the first to fourteenth rows.

According to the activation of the word line WL [i] (i=1 to M, 1 to 14), data is read from the memory cell MC in the i-th row (i, j) (j=1 to N) to the bit line pair of BL [j], /BL [j]. Each sense amplifier in the sense amplifier group 5 is activated by a sense amplifier control signal SE and amplifies data of the bit line pair to be coupled.

According to the activation of the word line WL [i] (i=1 to M), the first comparator 9 compares the data of the bit line pairs BL [1], /BL [1] to BL [N], /BL [N] output from the N sense amplifiers with the data of the first search data line pairs SLA [1], /SLA [1] to SLA [N], /SLA [N]. Similarly, according to the activation of the word line WL [i] (i=15 to M, 1 to 14), the second comparator 10 compares the data of the bit line pairs BL [1], /BL [1] to BL [N], /BL [N] output from the N sense amplifiers with the data of the second search data line pairs SLB [1], /SLB [1] to SLB [N], /SLB [N].

For example, when the data of the memory cell MC in the tenth row (10, j) (j=1 to N) agrees with the value of the first N-bit search data (a1, a2, . . . aN) (shown in (4)) and the data of the memory cell MC in the twentieth row (20, j) (j=1 to N) agrees with the value of the first N-bit search data (a1, a2, . . . , aN) (shown in (5)), the first priority encoder 11 continues to latch the row address RA in the first tenth row (does not latch the row address in the twentieth row).

After the specification of the M-th row, from the first priority encoder 11, the coincident address HADA indicative of the row address RA in the tenth row that is latched is output. After the specification of the M-th row, the search control unit 7 outputs the coincident address HADA indicative of the row address RA in the tenth row output from the first priority encoder 11 to outside.

For example, when the data of the memory cell MC in the thirtieth row (30, j) (j=1 to N) agrees with the value of the second N-bit search data (b1, b2, . . . , bN) (shown in (6)) and the data of the memory cell MC in the second row (2, j) (j=1 to N) agrees with the value of the second N-bit search data (b1, b2, . . . , bN) (shown in (7)), the second priority encoder 12 latches the row address RA in the first thirtieth row. After that, when the row address RA returns to the first row, the second priority encoder 12 resets the address latched by the first row signal ADD1 and latches the row address RA in the second row. After the specification of the fourteenth row, from the second priority encoder 12, the coincident address HADB indicative of the row address RA of the second row that is latched is output. After the specification of the fourteenth row, the search control unit 7 outputs the coincident address HADB indicative of the row address RA of the second row output from the second priority encoder 12 to outside.

(Summary)

As described above, according to the semiconductor device in the first embodiment, because it is possible to perform a search of the next data while performing a search of certain data, the times of reading of data from a memory cell can be reduced compared to the case where a search of the next data is performed after a search of certain data is completed, and therefore, low power consumption can be realized.

Modified Example of First Embodiment

In the present invention, two comparators and two priority encoders are provided and the first search and the second search are performed simultaneously during a partial period, however, it may also be possible to comprise N comparators and N priority encoders and perform N searches during a partial period. In this case, it is required for the search control unit to cause the address generator to further generate sequentially one or a plurality of row address(es) from the top row address to the (K−1)th row address when the K-th row address is generated by giving the i-th search data to the i-th comparator according to the i-th search command and after the maximum row address is generated by giving the N-th search data to the N-th comparator according to the N-th search command.

Second Embodiment

In the first embodiment, search data is given from outside and an address that agrees with the search data given from outside of the data stored within the memory array is output.

In contrast to this, in a second embodiment, the address of the memory cell array in the first embodiment is stored as data of the memory cell array and the data stored in the memory cell array in the first embodiment is given from outside as an address. By reading the data of the memory cell array corresponding to the address given from outside, the same search as that in the first embodiment can be performed. The search system in the second embodiment is called a reverse system.

(Example 1 of Configuration of Memory Cell Array and Data to be Stored)

Figure 9:
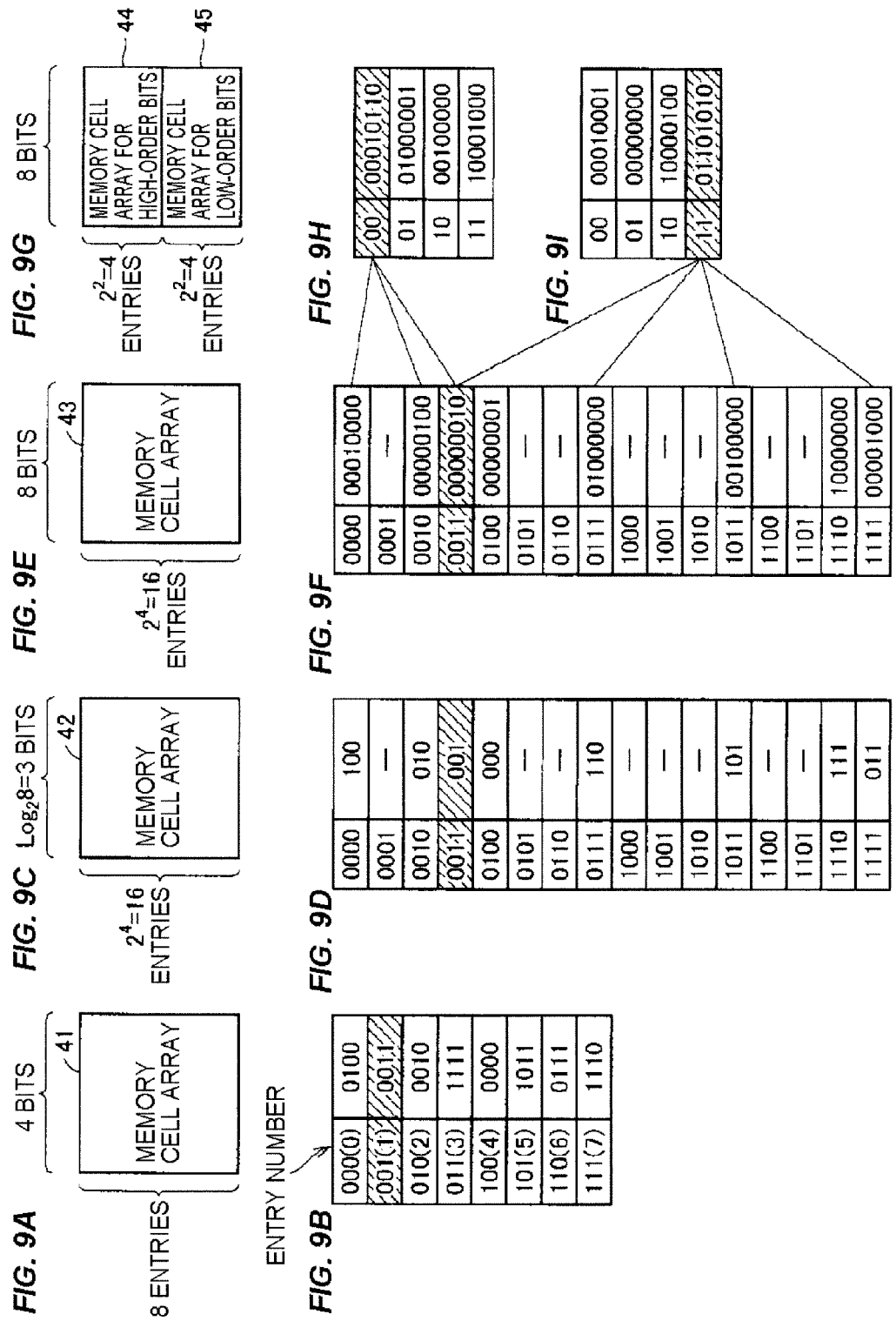
FIG. 9 is a diagram for explaining data stored in a memory cell array and its address in a second embodiment.

FIG. 9 is a diagram for explaining data stored in a memory cell array in the second embodiment and its address. In FIG. 9, for the convenience of explanation, the size of the memory cell array is reduced compared to the actual one.

FIGS. 9(a) and 9(b) are diagrams for explaining data stored in the system described in the first embodiment and its address.

As shown in FIG. 9(a), a memory cell 41 includes (8) rows×(4) columns. That is, the memory cell array includes eight entries and in each entry, a 4-bit value is stored.

FIG. 9(b) shows an example of a 4-bit value stored in each entry of the memory cell array 41. For example, in an entry the entry number (address) of which is "001" (=1), data "0011" is stored.

FIGS. 9(c) and 9(d) show those in FIGS. 9(a) and 9(c) converted into the reverse system. As shown in FIG. 9(c), a memory cell array 42 includes ($2^4$) rows×($Log_2$ 8) columns. That is, the memory cell array 42 includes $2^4$ entries and in each entry, a $Log_2$ 8-bit value is stored.

While data "0011" is stored in address "001" in FIG. 9(b), in FIG. 9(d), this relationship is reversed and in address "0011", data "001" is stored.

FIGS. 9(e) and 9(f) show the format of data stored in the memory cell array in FIGS. 9(c) and 9(d) is converted.

As shown in FIG. 9(e), a memory cell array 43 includes ($2^4$) rows×(8) columns. That is, the memory cell array 43 includes $2^4$ entries and in each entry, an 8-bit value is stored.

A value "n" of the data in FIG. 9(d) is converted into a value which has "1" for the (n+1)th bit from the least significant bit and "0" for the other bits in FIG. 9(f).

For example, while data "001" is stored in address "0011" in FIG. 9(d), in FIG. 9(f), data "00000010" is stored in address "0011".

FIGS. 9(g), 9(h) and 9(i) show those in FIGS. 9(e) and 9(f) converted by address division.

As shown in FIG. 9(g), the memory cell array is divided into a memory cell array for high-order bits 44 and a memory cell array for low-order bits 45 and each memory cell array includes ($2^2$) rows×(8) columns.

In the memory cell array for high-order bits 44 in FIG. 9(g), the logical sum of data of a plurality of entries specified by the two high-order bits in FIG. 9(e) is stored.

In the memory cell array for low-order bits 45 in FIG. 9(g), the logical sum of data of a plurality of entries specified by the two low-order bits in FIG. 9(e) is stored.

The address specified from outside is divided into two high-order bits and two low-order bits. From the memory cell array for high-order bits 44, data of the entry specified by the two divided high-order bits is read. From the memory cell array for low-order bits 45, data of the entry specified by the two divided low-order bits is read. Then, the logical product of the data read from the two memory cell arrays 44, 45 is calculated. When the value of "1" of the logical product is located at the n-th bit from the least significant bit, (n−1) is output as data corresponding to the address specified from outside.

FIG. 9(h) shows data stored in the memory cell array for high-order bits. For example, the logical sum of data stored in addresses "0000", "0010", and "0011" the address of the two high-order bits of which is "00" in FIG. 9(f) is stored in address "00" in FIG. 9(h). That is, in FIG. 9(f), in addresses "0000", "0010", and "0011", data "00010000", "00000100", and "00000010" are stored, and therefore, in FIG. 9(h), their logical sum "00010110" is stored in address "00".

FIG. 9(i) shows data stored in the memory cell array for low-order bits. For example, the logical sum of data stored in addresses "0011", "0111", "1011", and "1111" the address of the two low-order bits of which is "11" in FIG. 9(f) is stored in address "11" in FIG. 9(i). That is, in FIG. 9(f), in addresses "0011", "0111", "1011", and "1111", data "00000010", "01000000", "00100000", and "00001000" are stored, and therefore, in FIG. 9(i), their logical sum "01101010" is stored in address "11".

When address "0001" is specified from outside, data "00010110" of the entry specified by two high-order bits "00" is read from the memory cell array for high-order bits 44 and data "01101010" of the entry specified by two low-order bits "11" is read from the memory cell array for low-order bits 45. Then, the logical product of the two pieces of read data is "00000010" and "1" is located at the second bit from the least significant bit, and therefore, "1" (="001") is output.

According to the summary of the above-described explanation, in the system in the first embodiment in FIGS. 9(a) and 9(b), search data "0011" is given from outside and address "001" that agrees with the search data given from outside is output of the data stored in the memory cell array. In contrast to this, in the system in the second embodiment in FIGS. 9(g), 9(h) and 9(i), address "0011" is given from outside and data "1" (="001") corresponding to the address is output. Due to this, in the second embodiment also, the same search as that in the first embodiment can be performed.

(Example 2 of Configuration of Memory Cell Array and Data to be Stored)

Figure 10:
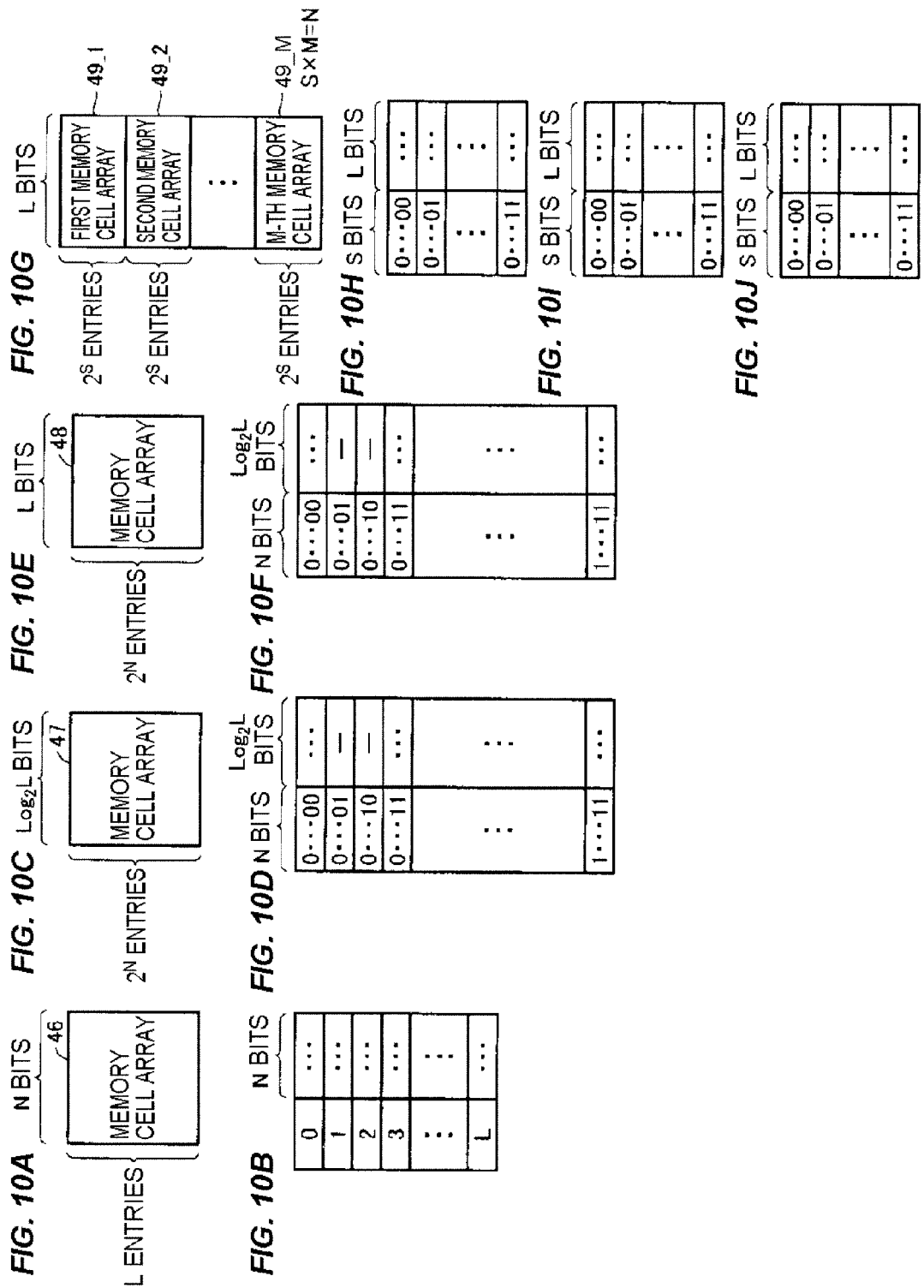
FIG. 10 is a diagram for explaining data stored in the memory cell array and its address in the second embodiment.

FIG. 10 is a diagram for explaining data stored in the memory cell array and its address in the second embodiment.

FIGS. 10(a) and 10(b) show data stored in the system shown in the first embodiment and its address. FIG. 10 corresponds to FIG. 9 that is more generalized.

As shown in FIG. 10(a), a memory cell array 46 includes (L) rows×(N) columns. That is, the memory cell array includes L entries and in each entry, an N-bit value is stored. FIG. 10(b) shows an example of an N-bit value stored in each entry of the memory cell array.

FIGS. 10(c) and 10(d) show those in FIGS. 10(a) and 10(c) converted into the reverse system.

As shown in FIG. 10(c), a memory cell array 47 includes ($2^N$) rows×($Log_2$ L) columns.

FIGS. 10(e) and 10(f) show those in FIGS. 10(c) and 10(d) the format of data stored in the memory cell array of which is converted.

As shown in FIG. 10(e), a memory cell array 48 includes ($2^4$) rows×(8) columns. A value "n" of data in FIG. 10(d) is converted into a value which has "1" for the (n+1)th bit from the least significant bit and "0" for the other bits in FIG. 10(f).

FIGS. 10(g) to 10(j) show those in FIGS. 10(e) and 10(f) converted by address division.

As shown in FIG. 10(g), the memory cell array is divided into a first memory cell array 49_1, a second memory cell array 49_2, . . . , an M-th memory cell array 49_M. Each memory cell array includes ($2^S$) rows×(L) columns. Here, S×M=N.

In the first memory cell array 49_1 in FIG. 10(g), the logical sum of data of S entries specified by S bits from the highest-order bit in FIG. 10(e) is stored. In the second memory cell array 49_2 in FIG. 10(g), the logical sum of data of S entries specified by the (S+1)th bit from the highest-order bit to the 2S-th bit from the highest-order bit in FIG. 10(e) is stored. In the M-th memory cell array 49_M in FIG. 10(g), the logical sum of data of S entries specified by S bits from the least significant bit in FIG. 10(e) is stored. Here, when there is no data in the entry for which the logical sum is calculated, the logical sum is calculated by regarding that all the bits in the entry are 0.

An address specified from outside is divided into groups of S bits each. From the first memory cell array 49_1, data of the entries specified by the divided S bits from the highest-order bit is read. From the second memory cell array 49_2, data of the entries specified by the divided (S+1)th bit from the highest-order bit to the 2S-th bit from the highest-order bit is read. From the M-th memory cell array 49_M, data of the entries specified by the divided S bits from the least significant bit is read. Then, the logical product of the data read from the first to the M-th memory cell arrays is calculated. When the logical product "1" is located at the n-th bit from the least significant bit, (n−1) is output as data corresponding to the address specified from outside.

(Configuration)

Figure 11:
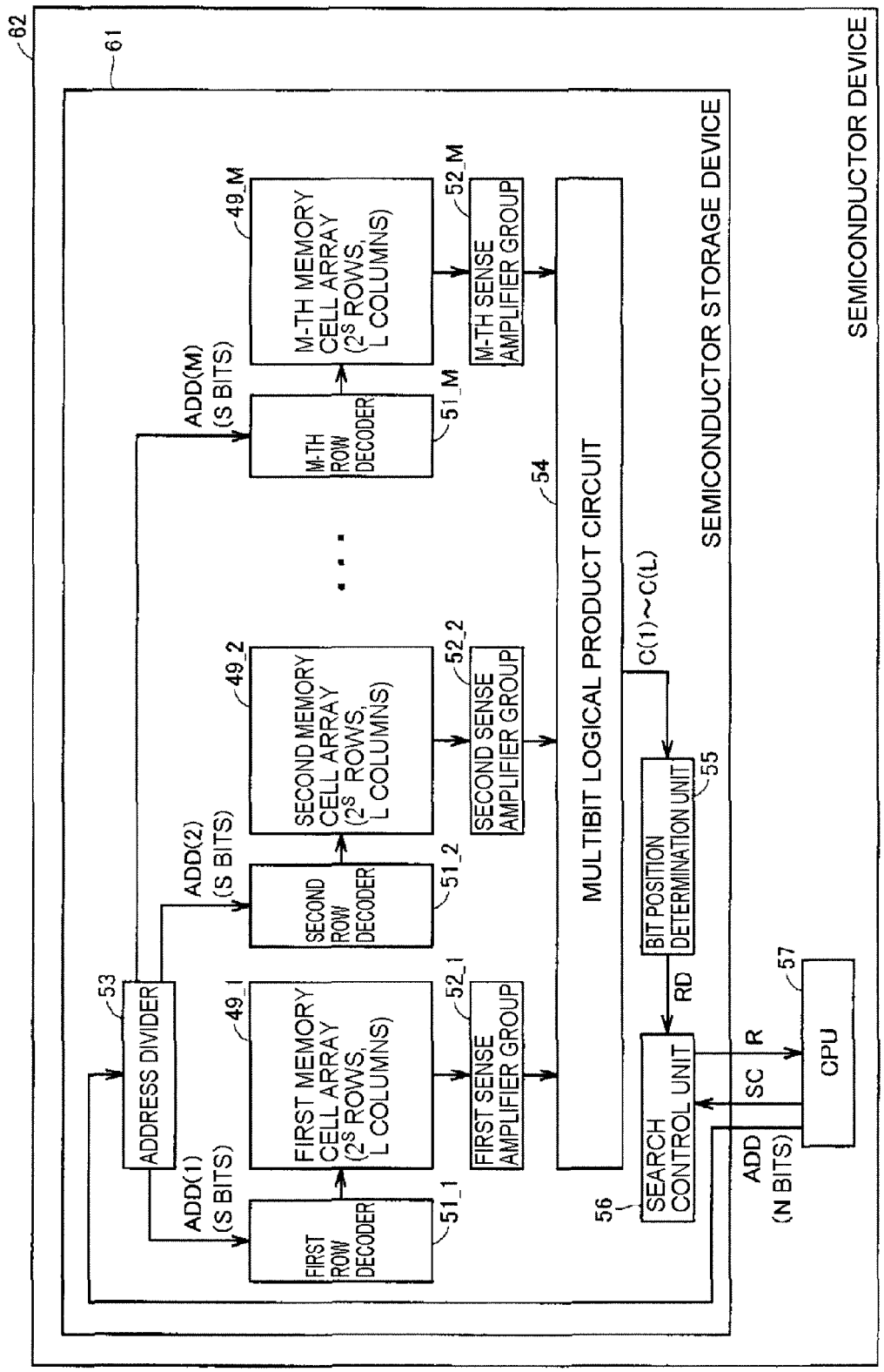
FIG. 11 is a diagram showing a configuration of a semiconductor device in the second embodiment.

FIG. 11 is a diagram showing a configuration of a semiconductor device in the second embodiment.

Referring to FIG. 11, a semiconductor device 62 includes a semiconductor storage device 61 and a CPU 57.

The CPU 57 gives the search command SC and address ADD to the semiconductor storage device 61. The CPU 57 receives data RD stored corresponding to ADD from the semiconductor storage device 61.

The semiconductor storage device 61 has M blocks each having a memory cell array, a row decoder, and a sense amplifier group. That is, the semiconductor storage device 61 has the first memory cell array 49_1, the second memory cell array 49_2, . . . , and the M-th memory cell array 49_M, a first row decoder 51_1, a second row decoder 51_2, . . . , and an M-th row decoder 51_M, and a first sense amplifier group 52_1, a second sense amplifier group 52_2, . . . , and an M-th sense amplifier group 52_M.

Further, the semiconductor storage device 61 comprises an address divider 53, a multibit logical product circuit 54, a bit position determination unit 55, and a search control unit 56.

The first memory cell array 49_1 is the same as that shown in FIG. 10(g) and has a plurality of SRAM cells arranged in a matrix. The first memory cell array 49_1 stores such data as shown in FIG. 10(h). The second memory cell array 49_2 is the same as that shown in FIG. 10(g) and has a plurality of SRAM cells arranged in a matrix. The second memory cell array 49_2 stores such data as shown in FIG. 10(i). The M-th memory cell array 49_M is the same as that shown in FIG. 10(g) and has a plurality of SRAM cells arranged in a matrix. The M-th memory cell array 49_M stores such data as shown in FIG. 10(j).

The address divider 53 divides the N-bit address ADD specified from outside into groups of S bits each. The address divider 53 outputs address ADD (1) including the divided S bits from the highest-order bit to the first row decoder 51_1. The address divider 53 outputs address ADD (2) including the divided (S+1)th bit from the highest-order bit to the 2S-th bit from the highest-order bit to the second row decoder 51_2. The address divider 53 outputs address ADD (M) including the divided S bits from the least significant bit to the M-th row decoder 51_M.

The first row decoder 51_1 activates the word line WL within the first memory cell array 49_1 according to ADD (1) output from the address divider 53. The second row decoder 51_2 activates the word line WL within the second memory cell array 49_2 according to ADD (2) output from the address divider 53. The M-th row decoder 51_M activates the word line WL within the M-th memory cell array 49_M according to ADD (M) output from the address divider 53.

The first sense amplifier group 52_1 comprises a sense amplifier provided for each column. When the sense amplifier control signal SA is activated to "H" level, each sense amplifier amplifies and outputs a voltage of a bit line pair in the corresponding column in the first memory cell array 49_1. The second sense amplifier group 52_2 comprises a sense amplifier provided for each column. When the sense amplifier control signal SA is activated to "H" level, each sense amplifier amplifies and outputs a voltage of a bit line pair in the corresponding column in the second memory cell array 49_2. The N-th sense amplifier group 52_M comprises a sense amplifier provided for each column. When the sense amplifier control signal SA is activated to "H" level, each sense amplifier amplifies and outputs a voltage of a bit line pair in the corresponding column in the M-th memory cell array 49_M.

Figure 12:
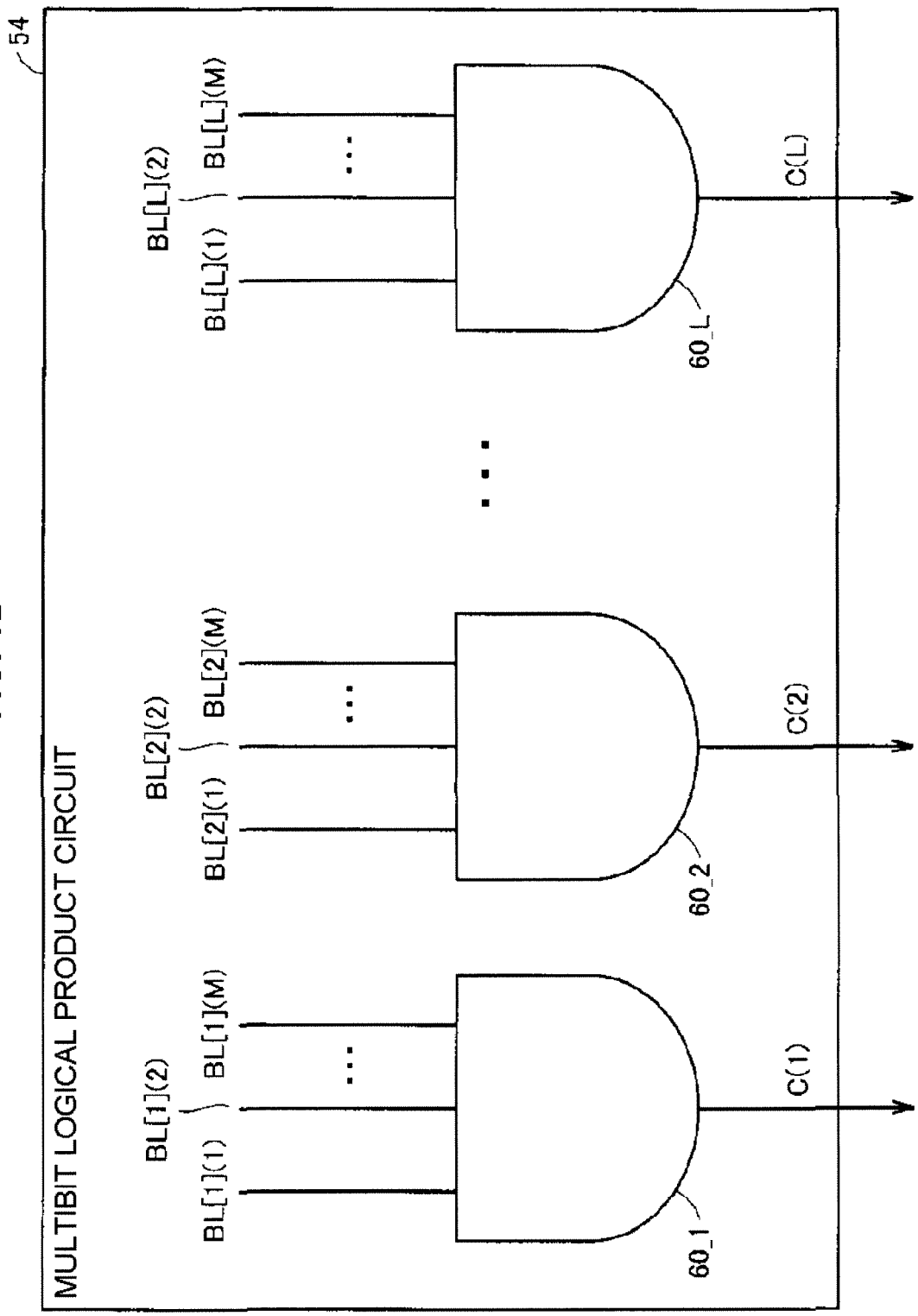
FIG. 12 is a diagram showing a configuration of a multibit logical product circuit in FIG. 11.

FIG. 12 is a diagram showing a configuration of the multibit logical product circuit in FIG. 11. Referring to FIG. 12, the multibit logical product circuit 54 comprises L logical product circuits 60_1 to 60_L and a bit coupler 71.

The logical product circuits 60_i outputs a logical product c (i) of data of the bit line BL [i] (1) in the i-th column of the first memory cell array 49_1, data of the bit line BL [i] (2) in the i-th column of the second memory cell array 49_2, . . . , and data of the bit line BL [i] (M) in the i-th column of the M-th memory cell array 49_M.

The bit position determination circuit 55 outputs (n−1) as the data RD corresponding to the address ADD specified from outside when data whose value is "1" of L pieces of data C(1) to C(L) output from the multibit logical product circuit 54 is c(n).

The search control unit 56 starts a search of data corresponding to the address ADD from outside when the search command SC is executed from outside. Further, the search control unit 56 outputs the data RD output from the bit position determination unit 55 to outside.

(Summary)

As described above, according to the second embodiment, it is not necessary to read all the data for comparison as is necessary in the first embodiment and by reading data corresponding to an address, data that is read can be regarded as a search result, and therefore, it is possible to make an attempt to reduce power consumption.

Third Embodiment

Figure 13:
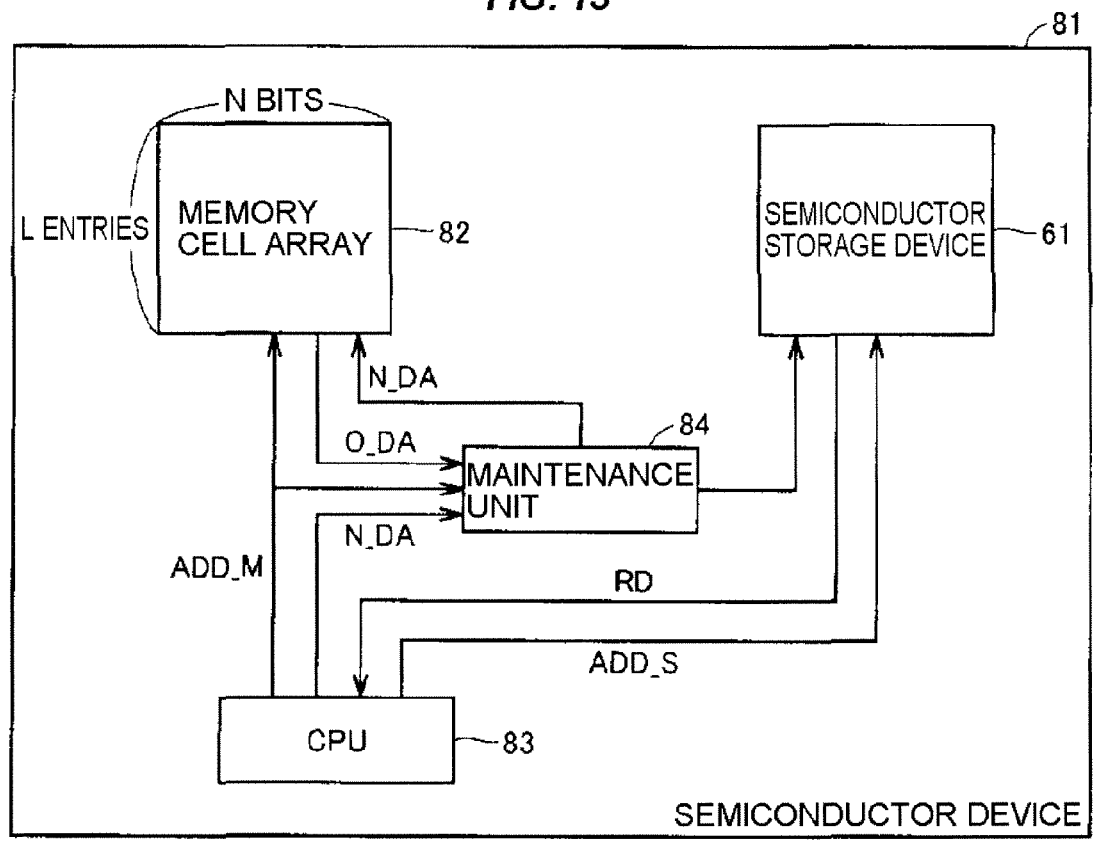
FIG. 13 is a diagram showing a configuration of a semiconductor device in a third embodiment.

FIG. 13 is a diagram showing a configuration of a semiconductor device in a third embodiment.

Referring to FIG. 13, a semiconductor device 81 comprises a CPU 83, a memory cell array 82, the semiconductor storage device 61 in the second embodiment, and a maintenance unit 84.

The memory cell array 82 has a plurality of memory cells arranged in a matrix and stores data from which the data in the reverse system stored in the semiconductor storage device 61 originates.

The CPU 83 gives address ADD_S to the semiconductor storage device 61 at the time of a search as in the second embodiment and receives the data RD corresponding to the address ADD_S from the semiconductor storage device 61. The CPU 83 gives new data N_DA corresponding to address ADD_M to the maintenance unit 84 at the time of maintenance.

(Maintenance Processing)

Next, the maintenance processing by the maintenance unit 84 is explained.

It is assumed that data shown in FIG. 9(b) is stored in the memory cell array 82. It is also assumed that the semiconductor storage device 61 comprises a first memory cell array for high-order bits and a second memory cell array for low-order bits and in the first memory cell array for high-order bits and the second memory cell array for low-order bits, data shown in FIGS. 9(h) and 9(i), respectively, is stored.

Here, it is assumed that maintenance is performed so that data "0011" stored in the entry number "1" of the memory cell array 82 is changed to "0110".

"1" is input as ADD_M and from the row specified by ADD_M of the memory cell array 82, read data O_DA (="0011") is output.

The maintenance unit 84 changes "1" at the second bit from the least significant bit in the entry corresponding to address "00" of the first memory array to "0" and changes "1" at the second bit from the least significant bit in the entry corresponding to address "11" of the second memory array to "0" from the relationship of the read data O_DA ("0011") corresponding to ADD_M (="1").

Next, the maintenance unit 84 changes "0" at the second bit from the least significant bit in the entry corresponding to address "01" of the first memory array to "1" and changes "0" at the second bit from the least significant bit in the entry corresponding to address "10" of the second memory array to "1" from the relationship of new data N_DATA (="0110") corresponding to ADD_M (="1"). Further, the maintenance unit writes the new data N_DA into the row specified by ADD_M of the memory cell array 82.

As described above, according to the semiconductor device in the third embodiment, by comprising a memory cell array that stores data from which the data in the reverse system stored in the memory cell in the second embodiment originates, it is made possible to modify and change data stored in the memory cell in the second embodiment.

The embodiments disclosed above are mere examples in all points and should not be considered limitative. The scope of the present invention is defined by claims not by the above-described explanation and it is intended that all modifications equivalent to claims in meaning and in the scope are all included.

What is claimed is:

1. A semiconductor storage device comprising:
a memory cell array including a plurality of memory cells arranged in a matrix;
a first comparator comparing data output to a bit line from the memory cell by activating a word line with first search data;
a second comparator comparing data output to the bit line from the memory cell by activating the word line with second search data;
an address generator sequentially generating a row address;
a row decoder activating any of word lines within the memory cell array according to the generated row address;
a first priority encoder coupled to the address generator and latching a row address when the first comparator determines coincidence; and
a second priority encoder coupled to the address generator and latching a row address when the second comparator determines coincidence,
wherein data output to the bit line by activating one word line is input to both the first comparator and second comparator,
wherein the first and second priority encoders latch a row address with higher priority if there is a plurality of row addresses when the coincidence is determined,
wherein the address generator cyclically generates row addresses from a small value in ascending order,
wherein the first and second priority encoders latch a row address with a smaller value if there is a plurality of row addresses when coincidence is determined, and
wherein the second priority encoder latches a row address when coincidence is determined first, resets at the same time a row address that is latched when the first row address is input, and latches a row address when coincidence is determined next.

2. A semiconductor storage device comprising:
a memory cell array including a plurality of memory cells arranged in a matrix;
a first comparator comparing data output to a bit line from the memory cell by activating a word line with first search data;
a second comparator comparing data output to the bit line from the memory cell by activating the word line with second search data;
an address generator sequentially generating a row address;
a row decoder activating any of word lines within the memory cell array according to the generated row address;
a first priority encoder coupled to the address generator and latching a row address when the first comparator determines coincidence; and
a second priority encoder coupled to the address generator and latching a row address when the second comparator determines coincidence,
wherein data output to the bit line by activating one word line is input to both the first comparator and second comparator,
wherein the first and second priority encoders latch a row address with higher priority if there is a plurality of row addresses when the coincidence is determined,
wherein the address generator cyclically generates row addresses from a small value in ascending order, wherein the first and second priority encoders latch a row address with a smaller value if there is a plurality of row addresses when coincidence is determined, and wherein the semiconductor storage device causes the address generator to sequentially generate row addresses from a small value in ascending order, first according to an input of a search command, and if the next search command is input before the maximum row address is generated, the semiconductor storage device, when causing the address generator to generate the K-th row next, further causes the address generator to generate sequentially one or a plurality of row address(es) from the top row address to the (K−1)th row address after the maximum row address is generated.

* * * * *